(12) United States Patent
Setsompop et al.

(10) Patent No.: US 8,981,776 B2
(45) Date of Patent: Mar. 17, 2015

(54) METHOD FOR MAGNETIC RESONANCE IMAGING WITH CONTROLLED ALIASING

(75) Inventors: Kawin Setsompop, Charlestown, MA (US); Lawrence L Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 451 days.

(21) Appl. No.: 13/453,205

(22) Filed: Apr. 23, 2012

(65) Prior Publication Data

US 2013/0099784 A1    Apr. 25, 2013

Related U.S. Application Data

(60) Provisional application No. 61/478,291, filed on Apr. 22, 2011.

(51) Int. Cl.
| | | |
|---|---|---|
| *G01R 33/54* | (2006.01) | |
| *G01R 33/48* | (2006.01) | |
| *G01R 33/561* | (2006.01) | |
| *G01R 33/483* | (2006.01) | |

(52) U.S. Cl.
CPC ............ *G01R 33/54* (2013.01); *G01R 33/4826* (2013.01); *G01R 33/5611* (2013.01); *G01R 33/4835* (2013.01)
USPC ........................................................ 324/309

(58) Field of Classification Search
USPC ............................ 324/300–322; 600/410–435
See application file for complete search history.

(56) References Cited

U.S. PATENT DOCUMENTS

| | | | |
|---|---|---|---|
| 4,665,367 A | | 5/1987 | Kramer et al. |
| 5,323,110 A | | 6/1994 | Fielden et al. |
| 5,508,612 A | | 4/1996 | Kanazawa |
| 5,647,362 A | * | 7/1997 | Fuderer et al. ................ 600/410 |
| 5,928,146 A | * | 7/1999 | Itagaki et al. ................. 600/410 |
| 6,169,398 B1 | * | 1/2001 | Watanabe et al. ............. 324/309 |
| 6,366,091 B1 | * | 4/2002 | Takahashi et al. ............ 324/309 |
| 6,366,092 B1 | | 4/2002 | Ehnholm et al. |
| 6,541,970 B1 | * | 4/2003 | Takizawa et al. ............. 324/309 |
| 6,583,624 B1 | * | 6/2003 | Muthupillai et al. ......... 324/309 |
| 6,614,225 B1 | | 9/2003 | Feinberg |
| 6,777,934 B2 | * | 8/2004 | Takahashi et al. ............ 324/309 |
| 6,841,998 B1 | | 1/2005 | Griswold |
| 7,002,344 B2 | | 2/2006 | Griswold et al. |

(Continued)

OTHER PUBLICATIONS

Moeller, et al., fMRI with 16 Fold Reduction Using Multibanded Multislice Sampling, Proc. Intl. Soc. Mag. Reson. Med., 2008, 16:2366.

(Continued)

*Primary Examiner* — Dixomara Vargas
(74) *Attorney, Agent, or Firm* — Quarles & Brady, LLP

(57) ABSTRACT

A method for imaging a subject with a magnetic resonance imaging (MRI) system using controlled aliasing is provided. A radio frequency (RF) excitation field is applied to excite the spins in a volume-of-interest that may include multiple slice locations. Using the MRI system, a readout magnetic field gradient is established following the application of the RF excitation field to form echo signals. These echo signal receive a differential encoding by way of establishing, while the readout gradient is established, alternating magnetic field gradients along two directions, such as the partition-encoding and phase-encoding directions. Image data is acquired from the formed echo signals and images of the subject are reconstructed from the acquired image data.

20 Claims, 6 Drawing Sheets

(56) References Cited

U.S. PATENT DOCUMENTS

| | | | |
|---|---|---|---|
| 8,405,395 B2 * | 3/2013 | Setsompop et al. | 324/309 |
| 2011/0254548 A1 | 10/2011 | Setsompop et al. | |
| 2011/0286646 A1 | 11/2011 | Chen et al. | |
| 2012/0235684 A1 | 9/2012 | Stemmer | |

OTHER PUBLICATIONS

Moeller, et al., Unaliasing of Multiband Multislice EPI and GRE Imaging with GRAPPA, Proc. Intl. Soc. Mag. Reson. Med., 2009, 17:1544.

Reese, et al., Halving Imaging Time of Whole Brain Diffusion Spectrum Imaging and Diffusion Tractography Using Simultaneous Image Refocusing in EPI, Journal of Magnetic Resonance Imaging, 2009, 29:517-522.

Robson, et al., Comprehensive Quantification of Signal-to-Noise Ratio and g-Factor for Image-Based and k-Space-Based Parallel Imaging Reconstructions, Magn. Reson. Med., 2008, 60(4):895-907.

Wu, et al., Wideband MRI: A New Dimension of MR Image Acceleration, Proc. Intl. Soc. Mag. Reson. Med., 2009, 17:2678.

Breuer, et al., Controlled Aliasing in Parallel Imaging Results in Higher Acceleration (CAIPIRINHA) for Multi-Slice Imaging, Magnetic Resonance in Medicine, 2005, 53(3):684-691.

Breuer, et al., Controlled Aliasing in Volumetric Parallel Imaging (2D CAIPIRINHA), Magnetic Resonance in Medicine, 2006, 55:549-556.

Breuer, et al., Zigzag Sampling for Improved Parallel Imaging, Magnetic Resonance in Medicine, 2008, 60(2):474-478.

Larkman, et al., Use of Multicoil Arrays for Separation of Signal from Multiple Slices Simultaneously Excited, Journal of Magnetic Resonance Imaging, 2001, 13(2):313-317.

Moriguchi, et al., Further Scan Time Reduction of Bunched Phase Encoding Using Sensitivity Encoding, Proc. Intl. Soc. Mag. Reson. Med., 2005, 13:287.

Moriguchi, et al., Bunched Phase Encoding (BPE): A New Fast Data Acquisition Method in MRI, Magnetic Resonance in Medicine, 2006, 55(3):633-648.

Nunes, et al., Simultaneous Slice Excitation and Reconstruction for Single Shot EPI, Proc. Intl. Soc. Mag. Reson. Med., 2006, 14:293.

Pruessmann, et al., SENSE: Sensitivity Encoding for Fast MRI, Magnetic Resonance in Medicine, 1999, 42:952-962.

Pruessmann, et al., Advances in Sensitivity Encoding With Arbitrary k-Space Trajectories, Magnetic Resonance in Medicine, 2001, 46:638-651.

Setsompop, et al., Blipped CAIPIRHINA for Simultaneous Multi-Slice EPI with Reduced g-factor Penalty, Proc. Intl. Soc. Mag. Reson. Med., 2010, 18:551.

Tuch, Q-Ball Imaging, Magnetic Resonance in Medicine, 2004, 52:1358-1372.

Weaver, Simultaneous Multislice Acquisition of MR Images, Magnetic Resonance in Medicine, 1988, 8(3):275-284.

Wedeen, et al., Mapping Complex Tissue Architecture With Diffusion Spectrum Magnetic Resonance Imaging, Magnetic Resonance in Medicine, 2005, 54:1377-1386.

Yutzy, et al., Highly Accelerated Multislice Parallel Imaging: Cartesian vs Radial, Proc. Intl. Soc. Mag. Reson. Med., 2010, 18:550.

* cited by examiner

METHOD FOR MAGNETIC RESONANCE IMAGING WITH CONTROLLED ALIASING

CROSS-REFERENCE TO RELATED APPLICATION

This application claims the benefit of U.S. Provisional Patent Application Ser. No. 61/478,291 filed on Apr. 22, 2011 and entitled "METHOD FOR MAGNETIC RESONANCE IMAGING WITH CONTROLLED ALIASING".

STATEMENT REGARDING FEDERALLY SPONSORED RESEARCH

This invention was made with government support under RR014075 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for accelerated three-dimensional image data acquisition with an MRI system.

MRI uses the nuclear magnetic resonance ("NMR") phenomenon to produce images. When a substance such as human tissue is subjected to a uniform magnetic field ("main magnetic field"), $B_0$, the individual magnetic moments of the nuclei in the tissue attempt to align with this magnetic field, but precess about it in random order at their characteristic Larmor frequency, $\omega$. If the substance, or tissue, is subjected to an excitation magnetic field, $B_1$, that is in the plane transverse to the main magnetic field, $B_0$, and that is near the Larmor frequency, $\omega$, the net aligned magnetic moment of the nuclei may be rotated, or "tipped," into the transverse plane to produce a net transverse magnetic moment. A signal is emitted by the excited nuclei, or "spins," after the excitation magnetic field, $B_1$, is terminated. The emitted signal may be received and processed to form an image.

When utilizing these emitted "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically-proven pulse sequences and they also enable the development of new pulse sequences.

Depending on the technique used, many MR scans currently require many minutes to acquire the necessary data used to produce medical images. The reduction of this scan time is an important consideration, since reduced scan time increases patient throughout, improves patient comfort, and improves image quality by reducing motion artifacts. Many different strategies have been developed to shorten the scan time.

One such strategy is referred to generally as "parallel MRI" ("pMRI"). Parallel MRI techniques use spatial information from arrays of radio frequency ("RF") receiver coils to substitute for the spatial encoding that would otherwise have to be obtained in a sequential fashion using RF pulses and magnetic field gradients, such as phase and frequency encoding gradients. Each of the spatially independent receiver coils of the array carries certain spatial information and has a different spatial sensitivity profile. This information is utilized in order to achieve a complete spatial encoding of the received MR signals, for example, by combining the simultaneously acquired data received from each of the separate coils. Parallel MRI techniques allow an undersampling of k-space by reducing the number of acquired phase-encoded k-space sampling lines, while keeping the maximal extent covered in k-space fixed. The combination of the separate MR signals produced by the separate receiver coils enables a reduction of the acquisition time required for an image, in comparison to a conventional k-space data acquisition, by a factor related to the number of the receiver coils. Thus the use of multiple receiver coils acts to multiply imaging speed, without increasing gradient switching rates or RF power.

Two categories of such parallel imaging techniques that have been developed and applied to in vivo imaging are so-called "image space methods" and "k-space methods." An example of an image space method is known in the art as sensitivity encoding ("SENSE"), while an example of a k-space method is known in the art as simultaneous acquisition of spatial harmonics ("SMASH"). With SENSE, the undersampled k-space data is first Fourier transformed to produce an aliased image from each coil, and then the aliased image signals are unfolded by a linear transformation of the superimposed pixel values. With SMASH, the omitted k-space lines are synthesized or reconstructed prior to Fourier transformation, by constructing a weighted combination of neighboring k-space lines acquired by the different receiver coils. SMASH requires that the spatial sensitivity of the coils be determined, and one way to do so is by "autocalibration" that entails the use of variable density k-space sampling.

A more recent advance to SMASH techniques using autocalibration is a technique known as generalized autocalibrating partially parallel acquisitions ("GRAPPA"), as described, for example, in U.S. Pat. No. 6,841,998. With GRAPPA, k-space lines near the center of k-space are sampled at the Nyquist frequency, in comparison to the undersampling employed in the peripheral regions of k-space. These center k-space lines are referred to as the so-called autocalibration signal ("ACS") lines, which are used to determine the weighting factors that are utilized to synthesize, or reconstruct, the missing k-space lines. In particular, a linear combination of individual coil data is used to create the missing lines of k-space. The coefficients for the combination are determined by fitting the acquired data to the more highly sampled data near the center of k-space.

Conventional parallel MRI techniques rely on accelerating standard image acquisitions by undersampling k-space. For example, these methods undersample k-space by reducing the number of phase-encodings acquired during each repetition of a pulse sequence. In three-dimensional acquisitions, k-space can be further undersampled along the partition-encoding direction, which may also be referred to as a second phase-encoding direction.

Recent modifications to standard rectilinear 3D k-space sampling trajectories have provided more robust parallel imaging reconstructions of highly undersampled datasets. For example, in the 2D CAIPIRINHA method described by F. A. Breuer, et al., in "Controlled Aliasing in Volumetric Parallel Imaging (2D CAIPIRINHA)," *Magnetic Resonance in Medicine*, 2006; 55(3):549-556, the phase encoding sampling strategy is modified to shift the spatial aliasing pattern to reduce aliasing and to better exploit coil sensitivity variations. In another method referred to as bunched phase encoding ("BPE") and described by H. Moriguchi and J. L. Duerk in "Bunched Phase Encoding (BPE): A New Fast Data Acquisition Method in MRI," *Magnetic Resonance in Medicine,* 2006; 55(3):633-648, an alternating phase-encoding gradient is applied during the readout of each k-space line to create a zigzag trajectory so that multiple k-space lines can be simultaneously acquired. The image data acquired using the BPE method can be reconstructed using Papoulis's generalized sampling theory to give an alias-free image. BPE has also been combined with parallel imaging, whereby the zigzag trajectory allows for utilization of the coil sensitivity variation in the readout direction to improve reconstruction. While both of these methods provide for improvements in three-dimensional acquisitions, they still suffer from g-factor related SNR reductions common to parallel imaging acquisitions and reconstructions.

In general, the 2D CAIPIRINHA and BPE methods seek to reduce the g-factor penalty of parallel imaging by improving the sampling pattern of the accelerated k-space trajectory, thereby spreading the aliasing patterns in a manner more favorable to separating the aliased signals. However, at high acceleration factors, the benefits that these methods provide to this end are limited.

It would therefore be desirable to provide a method for accelerated three-dimensional MRI, in which increased acceleration can be utilized without detrimentally affecting the g-factor performance of the data acquisition.

SUMMARY OF THE INVENTION

The present invention overcomes the aforementioned drawbacks by providing a method for magnetic resonance imaging ("MRI") using controlled aliasing. In general, the method utilizes alternating magnetic field gradients that are played out during the application of a readout gradient along one or more directions, such as the partition-encoding and phase-encoding directions, to impart a differential encoding to echo signals acquired as the alternating gradients are applied. This differential encoding provides additional information that is advantageously used to more effectively differentiate signals originating from locations in an excited volume-of-interest. This method is applicable both the three-dimensional acquisitions and to simultaneous multi-slice acquisitions, including when such acquisitions include in-place acceleration.

It is an aspect of the invention to provide a method for directing an MRI system to form echo signals from spins in a volume-of-interest. The method includes directing the MRI system to perform a pulse sequence. The pulse sequence includes generating a radio frequency ("RF") field that rotates a net magnetic moment of spins in a volume-of-interest and applying a readout magnetic field gradient to the volume-of-interest. The pulse sequence also includes applying a first alternating magnetic field gradient along a first spatial direction and applying a second alternating magnetic field gradient along a second spatial direction that is orthogonal to the first spatial direction. The readout magnetic field, the first alternating magnetic field gradient, and the second alternating magnetic field gradient are applied substantially contemporaneously after the RF field is generated so as to form an echo signal that includes spatial frequency information that is aliased in a pattern that distributes the aliased spatial frequency information in three dimensions in k-space.

It is another aspect of the invention to provide a method for imaging a subject with an MRI system by applying an RF excitation field to a portion of the subject that includes a volume-of-interest. A readout magnetic field gradient is established following the application of the RF excitation field to form echo signals. An alternating magnetic field gradient is established along a partition-encoding direction while the readout gradient is established, and another alternating magnetic field gradient is established along a phase-encoding direction orthogonal to the partition-encoding direction while the readout gradient and alternating gradient are established. Image data indicative of the echo signals is then acquired using, for example, an array of RF receiver coils. Images are then reconstructed from the acquired image data.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

The succeeding description is provided with reference to the following orthogonal spatial encoding directions common to magnetic resonance imaging ("MRI"): a partition-encoding, a phase-encoding direction, and a frequency-encoding direction. Alternatively, the partition-encoding direction may be simply referred to as a second phase-encoding direction. When two-dimensional images are acquired, the partition-encoding direction may be referred to as a slice-encoding direction. By way of example, as referred to herein, the partition-encoding direction corresponds to the z-direction in the image domain, which is aligned along the longitudinal axis of the bore of an MRI system, and the $k_z$-direction in k-space. In this manner, the obtained images are transverse, or axial, images lying in the x-y plane. Accordingly, as referred to herein, the phase-encoding direction corresponds to the y-direction in the image domain, and the $k_y$-direction in k-space; the frequency-encoding direction corresponds to the x-direction in the image domain, and the $k_x$-direction in k-space. It will be appreciated by those skilled in the art that any suitable permutation of these directions, or any set of orthogonal oblique directions, is possible and within the scope of the present invention. The choice of these directions is typically made depending on the desired imaging application, such as whether it is desirable to acquire axial, sagittal, coronal, or oblique images of a subject.

A method for the acquisition of image data with controlled aliasing using MRI, termed "wave-CAIPIRINHA," is provided. The method improves imaging performance when undersampling is present in one or two directions, and provides good g-factor performance for three-dimensional imaging. The provided method employs a k-space trajectory that effectively spreads aliasing patterns in all three spatial directions. This technique has the benefit of spreading the aliasing patterns throughout three dimensional space in a way that the aliasing patterns are spaced further apart on average. As a result of this spreading of the aliasing patterns, the aliased signals can be separated with less g-factor penalty than with previous methods.

Figure 1:
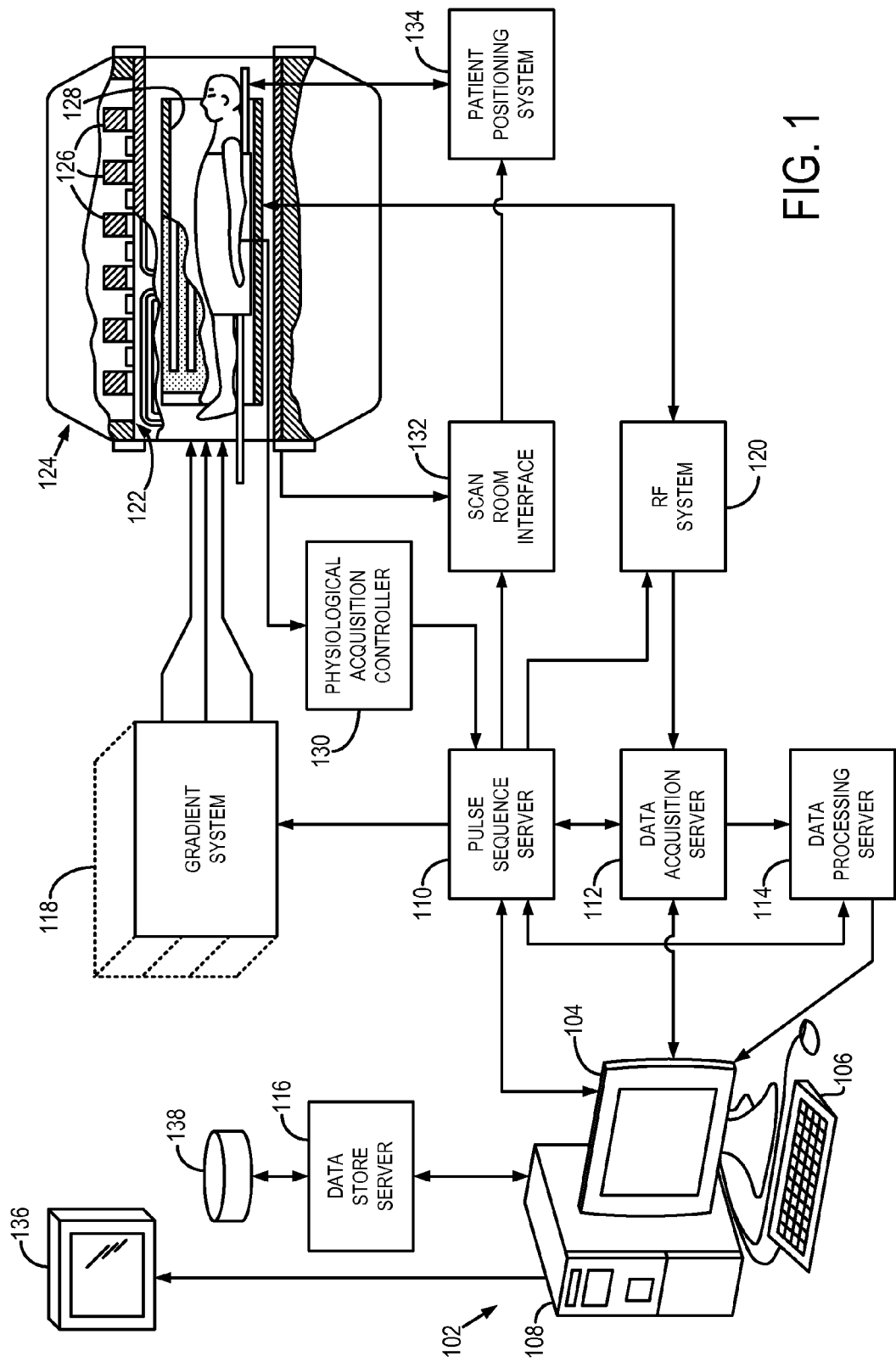
FIG. 1 is a block diagram of an example of a magnetic resonance imaging ("MRI") system.

Referring particularly now to FIG. 1, an example of an MRI system 100 is illustrated. The MRI system 100 includes a workstation 102 having a display 104 and a keyboard 106. The workstation 102 includes a processor 108, such as a commercially available programmable machine running a commercially available operating system. The workstation 102 provides the operator interface that enables scan prescriptions to be entered into the MRI system 100. The workstation 102 is coupled to four servers: a pulse sequence server 110; a data acquisition server 112; a data processing server 114, and a data store server 116. The workstation 102 and each server 110, 112, 114 and 116 are connected to communicate with each other.

The pulse sequence server 110 functions in response to instructions downloaded from the workstation 102 to operate a gradient system 118 and a radiofrequency ("RF") system 120. Gradient waveforms necessary to perform the prescribed scan are produced and applied to the gradient system 118, which excites gradient coils in an assembly 122 to produce the magnetic field gradients $G_x$, $G_y$, and $G_z$ used for position encoding MR signals. The gradient coil assembly 122 forms part of a magnet assembly 124 that includes a polarizing magnet 126 and a whole-body RF coil 128.

RF excitation waveforms are applied to the RF coil 128, or a separate local coil (not shown in FIG. 1), by the RF system 120 to perform the prescribed magnetic resonance pulse sequence. Responsive MR signals detected by the RF coil 128, or a separate local coil (not shown in FIG. 1), are received by the RF system 120, amplified, demodulated, filtered, and digitized under direction of commands produced by the pulse sequence server 110. The RF system 120 includes an RF transmitter for producing a wide variety of RF pulses used in MR pulse sequences. The RF transmitter is responsive to the scan prescription and direction from the pulse sequence server 110 to produce RF pulses of the desired frequency, phase, and pulse amplitude waveform. The generated RF pulses may be applied to the whole body RF coil 128 or to one or more local coils or coil arrays (not shown in FIG. 1).

The RF system 120 also includes one or more RF receiver channels. Each RF receiver channel includes an RF amplifier that amplifies the MR signal received by the coil 128 to which it is connected, and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad (1);$$

and the phase of the received MR signal may also be determined:

$$\phi = \tan^{-1}\left(\frac{Q}{I}\right). \qquad (2)$$

The pulse sequence server 110 also optionally receives patient data from a physiological acquisition controller 130. The controller 130 receives signals from a number of different sensors connected to the patient, such as electrocardiograph ("ECG") signals from electrodes, or respiratory signals from a bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized MR signal samples produced by the RF system 120 are received by the data acquisition server 112. The data acquisition server 112 operates in response to instructions downloaded from the workstation 102 to receive the real-time MR data and provide buffer storage, such that no data is lost by data overrun. In some scans, the data acquisition server 112 does little more than pass the acquired MR data to the data processor server 114. However, in scans that require information derived from acquired MR data to control the further performance of the scan, the data acquisition server 112 is programmed to produce such information and convey it to the pulse sequence server 110. For example, during prescans, MR data is acquired and used to calibrate the pulse sequence performed by the pulse sequence server 110. Also, navigator signals may be acquired during a scan and used to adjust the operating parameters of the RF system 120 or the gradient system 118, or to control the view order in which k-space is sampled. The data acquisition server 112 may also be employed to process MR signals used to detect the arrival of contrast agent in a magnetic resonance angiography ("MRA") scan. In all these examples, the data acquisition server 112 acquires MR data and processes it in real-time to produce information that is used to control the scan.

The data processing server 114 receives MR data from the data acquisition server 112 and processes it in accordance with instructions downloaded from the workstation 102. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 114 are conveyed back to the workstation 102 where they are stored. Real-time images are stored in a data base memory cache (not shown in FIG. 1), from which they may be output to operator display 112 or a display 136 that is located near the magnet assembly 124 for use by attending physicians. Batch mode images or selected real time images are stored in a host database on disc storage 138. When such images have been reconstructed and transferred to storage, the data processing server 114 notifies the data store server 116 on the workstation 102. The workstation 102 may be used by an operator to archive the images, produce films, or send the images via a network to other facilities.

In the provided wave-CAIPIRINHA method, additional differential encoding information is provided by the application of alternating gradients along the two directions orthogonal to the readout direction. The result of these gradients being played out in the presence of a readout gradient is to more uniformly distribute aliasing patterns throughout k-space, thereby improving the ability to separate the aliased signals. In this manner, the so-called g-factor penalty for parallel image reconstruction can be reduced. The provided wave-CAIPIRINHA method is not limited to rectilinear acquisitions; rather, it is applicable to other data acquisition schemes that include radial or spiral sampling. Several example pulse sequences are now provided herein.

Figure 2:
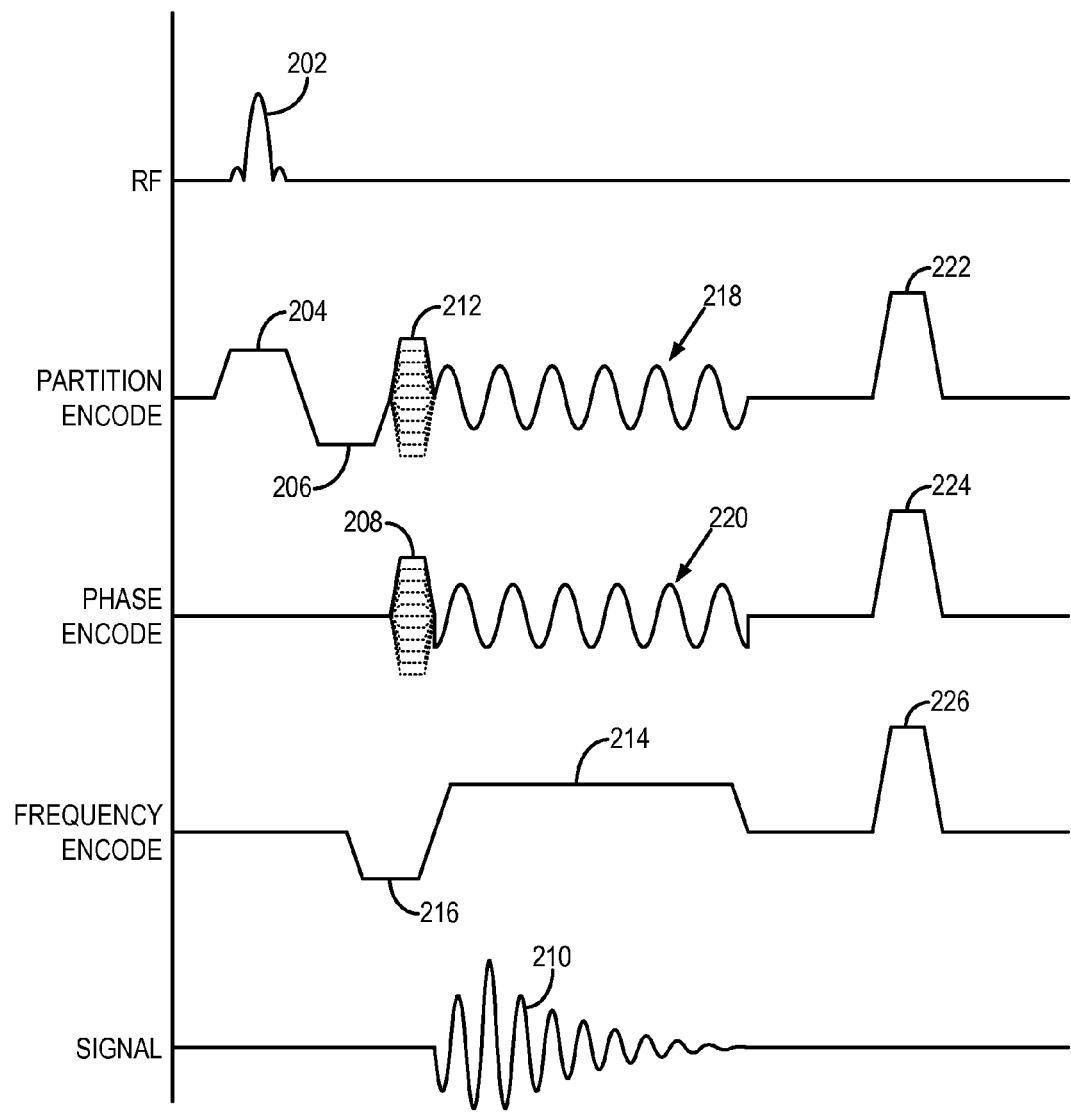
FIG. 2 is an example of a three-dimensional spoiled gradient-recalled echo ("3D SPGR") pulse sequence that includes alternating gradients applied along the partition-encoding and phase-encoding directions for differentially encoding image data acquired from a volume-of-interest.

An example of a pulse sequence employed to direct an MRI system to acquire image data in accordance with some embodiments of the present invention is illustrated in FIG. 2. The pulse sequence includes an RF excitation pulse 202 that is played out in the presence of a slab-selective gradient 204 in order to produce transverse magnetization in a volume-of-interest. The slab-selective gradient 204 includes a rephasing lobe 206 that acts to rephase unwanted phase dispersions introduced by the slab-selective gradient 204 such that signal losses resultant from these phase dispersions are mitigated.

Following excitation of the nuclear spins in the volume-of-interest, a phase-encoding gradient 208 is applied to spatially encode a nuclear magnetic resonance echo signal 210 representative of a gradient-recalled echo along one direction in the volume-of-interest. At the same time, a partition-encoding gradient 212 is applied to spatially encode the echo signal 210 along a second, orthogonal direction in the volume-of-interest. By way of example, the phase-encoding gradient 208 may spatially encode the echo signal 210 along the y-direction, while the partition-encoding gradient 212 may spatially encode the echo signal 210 along the z-direction. A readout gradient 214 is also applied after a dephasing gradient lobe 216 to spatially encode the echo signal 210 along a third, orthogonal direction in the volume-of-interest. By way of example, the readout gradient 214 may spatially encode the echo signal along the x-direction. The echo signal 210 is sampled during a data acquisition window.

During the application of the readout gradient 214, an alternating gradient 218 is applied along the partition-encoding direction. This alternating gradient 218 is played out during the acquisition of image data from the volume-of-interest and, therefore, acts to blur the acquired signals in k-space. At the same time, another alternating gradient 220 is played out along the phase-encoding direction. As illustrated in FIG. 2, the alternating gradients 218, 220 are preferably out-of-phase with each other, such as by one-fourth of a cycle. The combined effect of the alternating gradients 218, 220 being played out in the presence of the readout gradient 214 is to produce a k-space trajectory that more uniformly samples three-dimensional k-space by sampling k-space along a corkscrew-like trajectory. It will be appreciated that other relative phase shifts between the alternating gradients 218, 220 may also be employed to achieve this effect. While shown as sinusoidal waveforms, the alternating gradients 218, 220 may similarly include trapezoidal, square, or triangular gradient lobes. Moreover, the gradient lobes need not be symmetrical. In some instances, the alternating gradients 218, 220 may be self-refocusing.

Figure 2A:
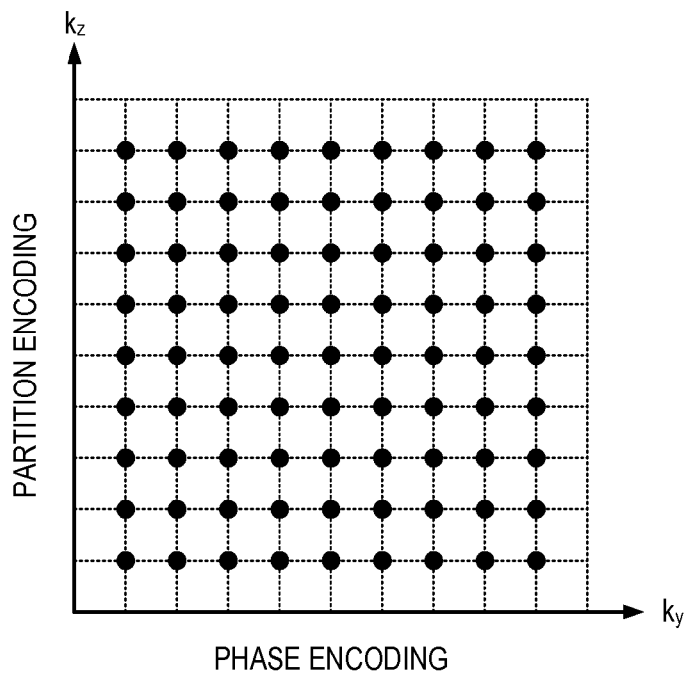
FIG. 2A is a graphic illustration of an example of a spacing of k-space trajectories in a uniform grid.
Figure 2B:
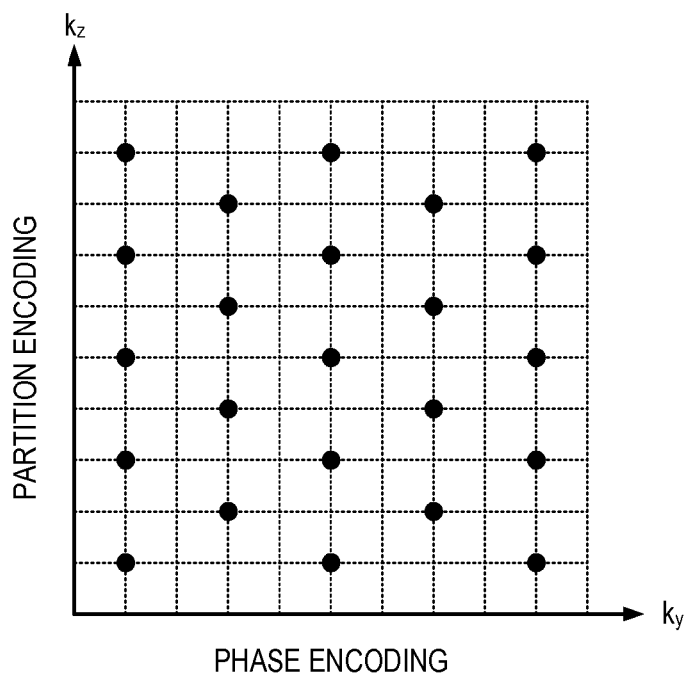
FIG. 2B is a graphic illustration of an example of a spacing of k-space trajectories in which k-space is undersampled and in which the k-space trajectories are spaced in a staggered spacing throughout k-space.

The k-space trajectories produced by the pulse sequence of FIG. 2 have a starting point that is defined by the amplitude and polarity of the phase-encoding and partition-encoding gradients 208, 212. The selection of the amplitude and polarity of the phase-encoding and partition-encoding gradients 208, 212 can be made in different ways to achieve different sampling of k-space. For example, the starting points may be evenly and uniformly distributed on a grid as illustrated in FIG. 2A or, borrowing from 2D CAIPIRINHA methods, may be distributed in k-space in a staggered pattern, as illustrated in FIG. 2B.

Figure 2C:
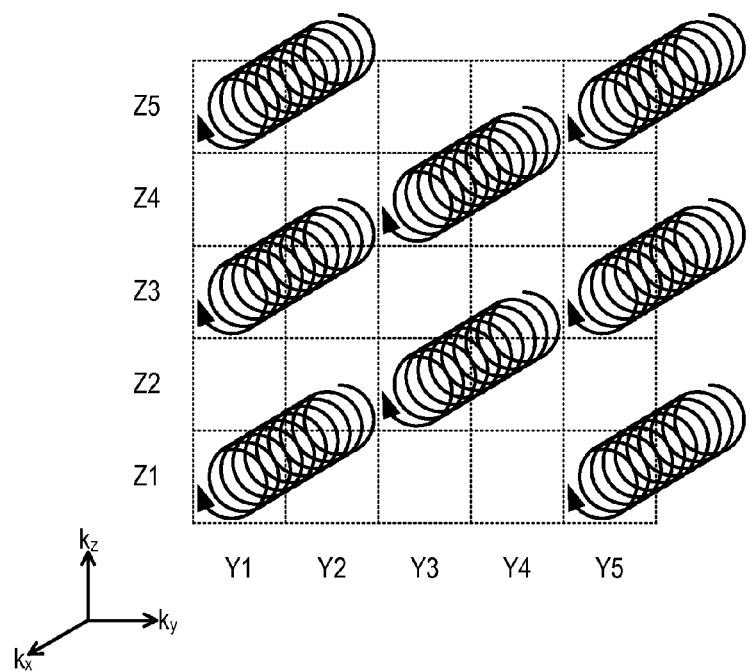
FIG. 2C is a graphic illustration of an example of a k-space trajectory produced by the pulse sequence of FIG. 2.
Figure 2D:
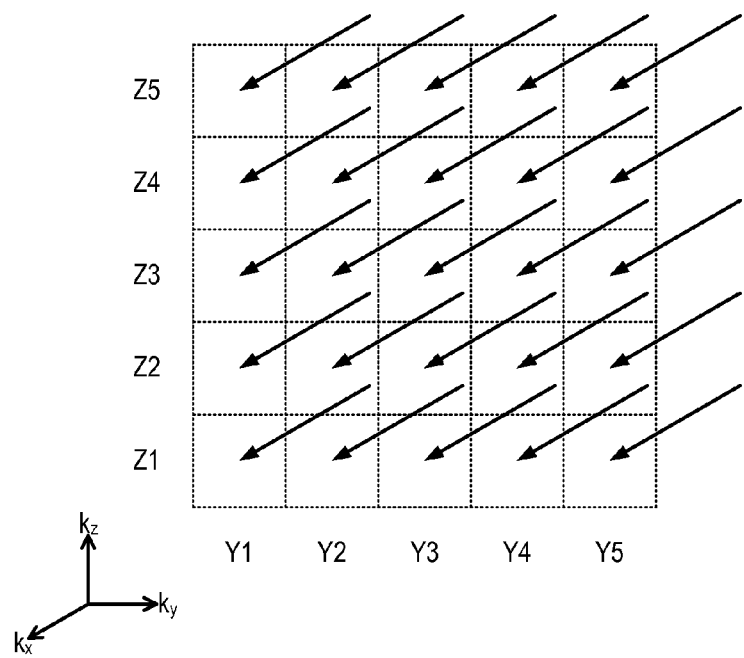
FIG. 2D is a graphic illustration of an example of a k-space trajectory for a conventional 3D SPGR pulse sequence.

By way of example, by staggering, or shifting, the starting positions of the k-space trajectories produced by the pulse sequence of FIG. 2 produces the k-space trajectories illustrated in FIG. 2C. These sampling trajectories results in the distribution of aliasing patterns in three spatial dimensions. By way of comparison, the k-space trajectory for a conventional 3D SPGR pulse sequence is illustrated in FIG. 2D. The aliasing patterns produced by the alternating gradients 218, 220 provides an additional differential encoding to the acquired signals that serves to improve the ability to differentiate between signals originating from different locations in the volume-of-interest by increasing the average distance between aliased signals. The example k-space trajectories illustrated in FIG. 2A illustrate an undersampling of k-space in both the partition-encoding and phase-encoding directions with an acceleration factor of R=3×3.

Spoiler gradients 222, 224, 226 are played out along the partition-encoding, phase-encoding, and frequency-encoding directions to dephase any residual transverse magnetization in the volume-of-interest to prevent signal contamination from one repetition time ("TR") period to the next. As is well known in the art, the pulse sequence may be repeated while the amplitude of the phase-encoding gradient 208 and partition-encoding gradient 216 are stepped through a set of values such that k-space is sampled in a prescribed manner, such as those manners described above. To decrease scan time, k-space may be undersampled along one or more directions, as is known in the art. For example, k-space may be undersampled by reducing the number of phase-encoding steps, the number of partition-encoding steps, or both. While this normally results in reduced SNR performance, with the added differential information provided by the alternating gradients 218, 220, the traditional parallel imaging g-factor SNR reduction can be mitigated.

Although the foregoing wave-CAIPIRINHA pulse sequence is a modified three-dimensional gradient-recalled echo sequence, it will be appreciated that similar modifications can be made to other pulses sequences. For example, a three-dimensional fast spin-echo pulse sequence, such as a three-dimensional rapid acquisition with relaxation enhancement ("RARE") pulse sequence, can also be modified to include the alternating gradients played out along the partition-encoding and phase-encoding directions while the readout gradient is applied.

It will also be appreciated that, in lieu of three-dimensional spatial encoding, the foregoing k-space sampling scheme can be applied to two-dimensional acquisitions with the simultaneous excitation of multiple slice locations.

Figure 3:
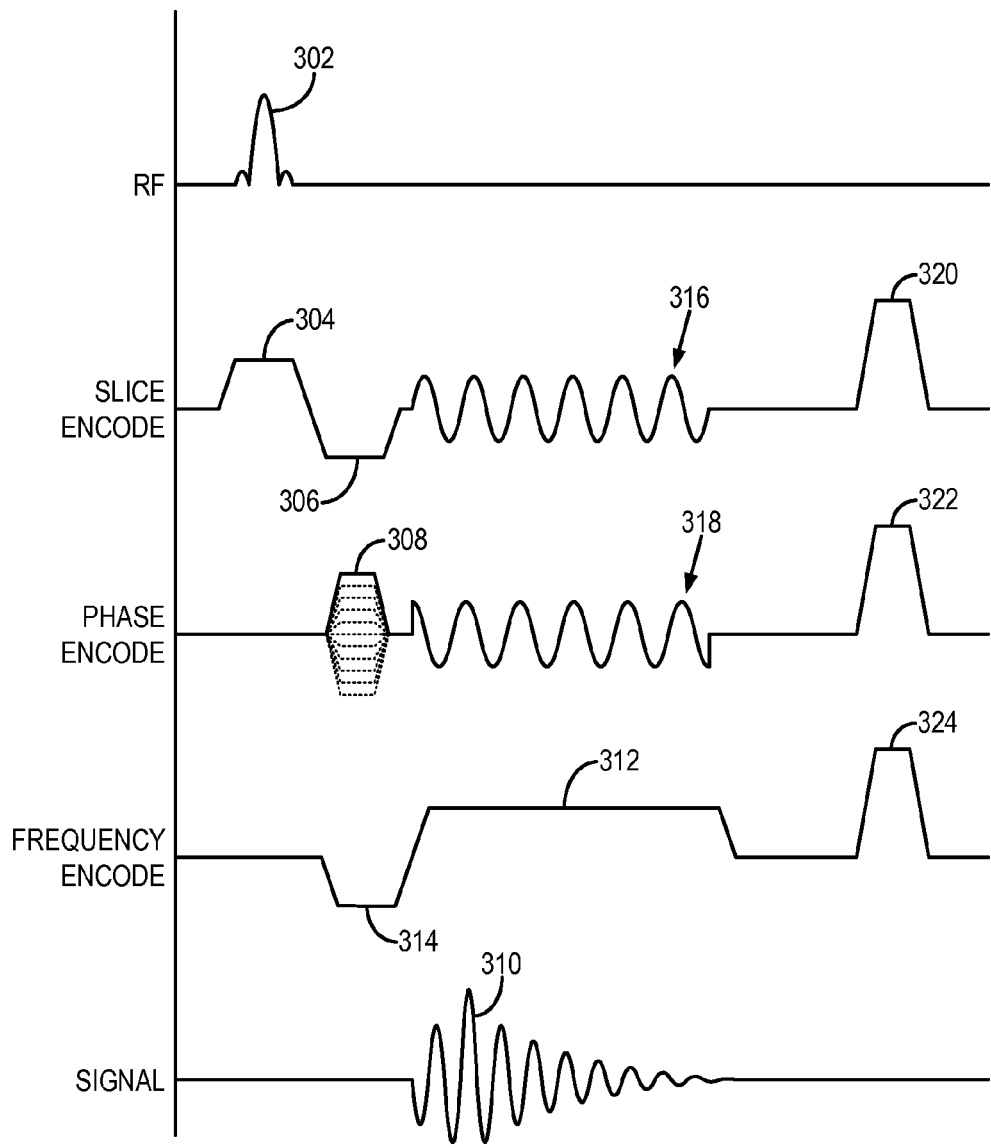
FIG. 3 is an example of a gradient-recalled echo ("GRE") pulse sequence that includes a self-refocusing slice-encoding gradient and self-refocusing phase-encoding gradient for differentially encoding image data acquired from multiple simultaneously excited slice locations.

An example of a multi-shot gradient-echo recalled pulse sequence, in which self-refocusing gradients are employed to spread out aliasing patterns, is illustrated in FIG. 3. The pulse sequence includes a spatially-selective RF excitation pulse 302 that is played out in the presence of a slice-selective gradient 304 in order to produce transverse magnetization in a plurality of prescribed imaging slices. The slice-selective gradient 304 includes a rephasing lobe 306 that acts to rephase unwanted phase dispersions introduced by the slice-selective gradient 304 such that signal losses resultant from these phase dispersions are mitigated.

To shift the aliasing patterns of multiple slice locations that are simultaneously excited with respect to one another, a phase-modulated multi-band RF excitation pulse may be utilized, similar to the CAIPIRINHA technique. Using such an RF excitation technique results in each of the simultaneously excited slice locations having a different phase imparted to it. In lieu of an RF excitation pulse that imparts phase shifts to the different imaging slices, a gradient blip can be added to the slice-encoding direction following the slice-selective gradient 304 to effect a similar phase shift. In these instances, a different gradient blip will be applied in different TR periods. For example, even-numbered TR periods may have a gradient blip applied and odd-numbered TR periods may have no gradient blip applied.

Following excitation of the nuclear spins in the prescribed imaging slices, a phase encoding gradient 308 is applied to spatially encode a nuclear magnetic resonance signal representative of a gradient-recalled echo 310 along one direction in the prescribed imaging slices. A readout gradient 312 is also applied after a dephasing gradient lobe 314 to spatially encode the signal representative of echo 310 along a second, orthogonal direction in the prescribed imaging slices. The signal representative of echo 310 is sampled during a data acquisition window.

During the application of the readout gradient 312, a self-refocusing gradient 316 is applied along the slice-encoding direction. This self-refocusing gradient 316 is played out during the acquisition of image data from the multiple slice locations and, therefore, acts to blur the acquired signals. At the same time, another self-refocusing gradient 318 is played out along the phase-encoding direction. As illustrated in FIG. 3, the self-refocusing gradients 316, 318 are preferably out-of-phase with each other, such as by one-fourth of a cycle. The effect of these self-refocusing gradients 316, 318 being out-of-phase with each other and being played out contemporaneously with the readout gradient 312 is to produce a blurring modulation function that is dependent on the positions of the different slice locations; thus, additional differential encoding information is provided. In this two-dimensional, simultaneous multi-slice acquisition implementation, this sampling trajectory results in the distribution of aliasing patterns both in the imaging plane of each slice location and across the multiple slice locations. The aliasing pattern produced by these self-refocusing gradients 316, 318 provides an additional differential encoding to the acquired signals that, as described above, serves to improve the ability to differentiate between signals originating from different slice locations.

Spoiler gradients 320, 322, 324 are played out along the slice-encoding, phase-encoding, and frequency-encoding directions to dephase any residual transverse magnetization in the multiple slice locations to prevent signal contamination from one TR period to the next. As is well known in the art, the pulse sequence may be repeated while the amplitude of the phase-encoding gradient 308 is stepped through a set of values such that k-space is sampled in a prescribed manner.

In the foregoing two-dimensional wave-CAIPIRINHA method, magnetic field gradients are applied along the slice-encoding direction and the phase-encoding direction while a readout gradient is being played out; however, these gradients are applied in a manner such that intravoxel dephasing does not accumulate. To achieve this condition, the self-refocusing slice-encoding and phase-encoding gradients 316, 318 are so-called "self-refocusing" gradients, in that the time integral over each cycle of each gradient waveform is zero. An example of a self-refocusing gradient waveform is a gradient having a sinusoidal waveform. Other examples of self-refocusing gradients include those with triangular waveforms, square waveforms, and self-refocusing trapezoidal waveforms.

Recently, a so-called "blipped-CAIPIRINHA" technique was proposed, in which an inter-slice imaging shift in the phase encode direction of an EPI acquisition is achievable without undesirable voxel tilting artifacts. Blipped-CAIPIRINHA is described in more detail in co-pending U.S. patent application Ser. No. 12/761,314, which is herein incorporated by reference in its entirety. With the blipped-CAIPIRINHA technique, an improved g-factor performance is achievable, even when the slice locations are relatively closely spaced.

Nonetheless, the g-factor performance of blipped-CAIPIRINHA acquisition can suffer quite significantly when standard in-plane acceleration is utilized during simultaneous multi-slice acquisition. As noted above, in-plane acceleration undersamples k-space along, for example, the phase-encoding direction. This undersampling introduces aliasing in the phase-encoding direction of each of the simultaneously acquired image slices. In turn, these aliasing artifacts reduce the amount of inter-slice image shift that can be achieved with blipped-CAIPIRINHA. For example, with an in-plane acceleration factor of R=2, the amount of inter-slice image shift achievable with blipped-CAIPIRINHA is limited to one-fourth of the full field-of-view ("FOV") rather than one-half of the full FOV. As a result of in-plane aliasing, any larger inter-slice shifts would result in a reduction in the distance between the overlapping pixels from the simultaneously acquired slices and, therefore, poorer g-factor performance. It is noted, however, that in-plane acceleration is important for, among others, high-resolution single-shot EPI acquisitions because such acceleration significantly mitigates undesirable image distortions that result from these rapid acquisitions.

In the instance of the simultaneous acquisition of image data from multiple slice locations, an echo-planar imaging ("EPI") pulse sequence can also be modified to implement the k-space sampling scheme described above. For an EPI acquisition, the wave-CAIPIRINHA method provides additional encoding information as a blurring modulation that is dependent on the positions of the imaging slices and, therefore, is different for each of the simultaneously acquired imaging slices. As a result, the blurring modulation provides extra differential encoding information between the simultaneously acquired slices, which acts to reduce the g-factor penalty of parallel image reconstruction.

Figure 4:
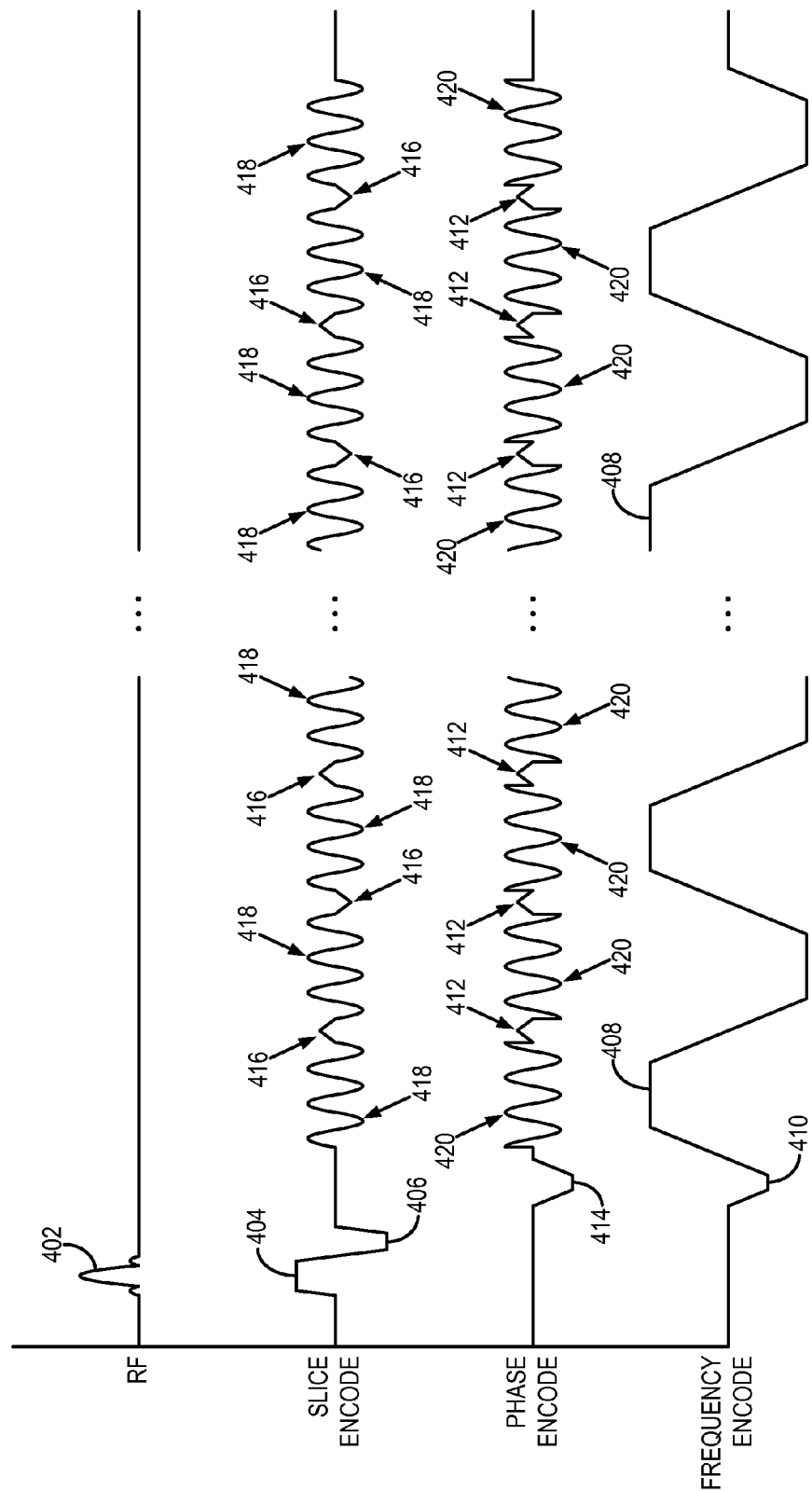
FIG. 4 is an example of an echo-planar imaging ("EPI") pulse sequence that includes a self-refocusing slice-encoding gradient, a self-refocusing phase-encoding gradients, and a series of successive slice-encoding gradient blips for differentially encoding image data acquired from multiple simultaneously excited slice locations.

An example of an EPI pulse sequence employed to direct the MRI system to acquire image data in accordance with some embodiments of the present invention is illustrated in FIG. 4. The example of an EPI pulse sequence is a gradient-recalled echo planar imaging ("EPI") pulse sequence that is modified to acquire image data from multiple slice locations simultaneously. The pulse sequence includes a spatially selective radio frequency ("RF") excitation pulse 402 that is played out in the presence of a slice-selective gradient 404 in order to produce transverse magnetization in a plurality of prescribed imaging slices. For example, three slice locations each separated by 4.2 centimeters ("cm") are selectively excited. The RF excitation pulse is the summation of RF excitation pulses that would be used to separately excite the desired plurality of slice locations and is applied with a flip angle, for example, of 70 degrees. The slice-selective gradient 404 includes a rephasing lobe 406 that acts to rephase unwanted phase dispersions introduced by the slice-selective gradient 404 such that signal losses resultant from these phase dispersions are mitigated.

Following excitation of the nuclear spins in the prescribed imaging slices, image data is acquired by sampling a series of gradient-recalled echo signals in the presence of an alternating readout gradient 408. The alternating readout gradient is preceded by the application of a pre-winding gradient 410 that acts to move the first sampling point along the frequency-encoding, or readout, direction by a distance $\Delta k_x$ in k-space. Spatial encoding of the echo signals along a phase-encoding direction is performed by a series of phase encoding gradient "blips" 412, which are each played out in between the successive signals readouts such that each echo signal is separately phase encoded. The phase encoding gradient blips 412 are preceded by the application of a pre-winding gradient 414 that acts to move the first sampling point along the phase-encoding direction a distance $\Delta k_y$ in k-space. Together, the pre-winding gradients 410 and 414 serve to begin the sampling of k-space at a defined k-space location $(k_x, k_y)$.

During the application of each phase encoding gradient blip 412, a magnetic field gradient blip is also played out along the slice-encoding direction. These slice-encoding gradient blips 416 act to shift the image of every other slice by one-half the imaging field-of-view ("FOV") along the phase encoding direction. Each successive slice-encoding gradient blip 416 is equal in magnitude and opposite in polarity than the preceding blip. In this manner, the slice-encoding gradient blips 416 do not produce phase accumulations in the phase-encoding direction in k-space because each successive blip 416 serves to unwind the phase accrued by the previous blip 416. However, each blip 416 does produce the desired phase shift between adjacent slice location encodings such that a one-half FOV shift is provided in the image domain. To achieve this one-half FOV shift in every other slice location, a relative phase increment of 180 degrees is applied to successive $k_y$ lines by appropriate design of the slice-encoding blips 416 in accordance with:

$$\Delta \phi = \gamma \Delta z \int_0^T G_z dt \qquad (3);$$

where $\Delta \phi$ is the relative phase increment; $\gamma$ is the gyromagnetic ratio for a given spin species; $G_z$ is the amplitude of the slice-encoding gradient blip 416; $\Delta z$ is the inter-slice spacing, or slice separation; and T is the duration of the slice-encoding gradient blip 416. Using this slice-encoding gradient blip scheme, through-plane dephasing is substantially mitigated, thereby providing a significant decrease in pixel tilt and image blurring. As described in co-pending U.S. patent application Ser. No. 12/761,314, other FOV shifts can be achieved through the appropriate design of the slice-encoding gradient blips 416.

Between the application of each slice-encoding gradient blip 416, a self-refocusing gradient 418 is applied along the slice-encoding direction. This self-refocusing gradient 418 is played out during the acquisition of image data from the multiple slice locations and, therefore, acts to blur the acquired signals. At the same time, another self-refocusing gradient 420 is played out along the phase-encoding direction. As illustrated in FIG. 4, the self-refocusing gradients 418, 420 are preferably out-of-phase with each other, such as by one-fourth of a cycle. The effect of these self-refocusing gradients 418, 420 being out-of-phase with each other and being played out contemporaneously with the readout gradient 408 is to produce a corkscrew trajectory along each k-space line. The aliasing pattern produced in the acquired signals, as generated by this corkscrew trajectory, provides an additional differential encoding to the signals that improves the ability to differentiate between signals originating from the multiple slice locations. As shown in FIG. 4, the polarity of the self-refocusing gradients 418, 420 change after each slice-encoding gradient blip 416 to account for the reversal of the EPI trajectory.

As is known in the art, the foregoing pulse sequence is repeated a plurality of times with a different RF excitation pulse 402 being applied in each repetition such that multiple sets of a plurality of slice locations are sampled.

In addition to the rectilinear sampling provided by the foregoing pulse sequences, the wave-CAIPIRINHA technique can be implemented with three-dimensional radial sampling trajectories; and radial and spiral sampling trajectories with simultaneous multi-slice acquisitions. For example, an alternating gradient may be added to the slice-encoding or partition-encoding direction so that the traditional radial and spiral trajectories become corkscrewed so that aliasing patterns are more uniformly spread out in k-space.

An example of a method for reconstructing images acquired in one of the foregoing manners is now provided. Because the aliasing function of the alternating encoding gradients is known prior to the data acquisition, a generalized-SENSE reconstruction can be used to separate and reconstruct the aliased imaging slices. The generalized-SENSE formulation can be expressed as:

$$k = E \cdot i \qquad (4);$$

where k is the vector of acquired k-space data, E is an encoding matrix, and i is the image vector sought, usually via conjugate gradient. The encoding matrix, E, can often times be very large and, therefore, computationally burdensome to invert; however, in some instances various iterative techniques, such as the conjugate gradient method, may be used to find the target images, i. Thus, it is a discovery that the encoding matrix, E, may be sparsified so that it can be decoupled into a number of small, simple to invert independent matrices. This is achieved by multiplying the encoding matrix, E, with a uniform inverse discrete Fourier transform ("iDFT") matrix, D, which is the matrix that provides transformation from k-space to the image domain if the alternating encoding gradients were not applied. This multiplication results in the following expression:

$$\tilde{k} = D \cdot E \cdot i = \tilde{E} \cdot i \qquad (5);$$

where $\tilde{E}$ is the sparsified encoding matrix, and the k-space data, k, has been transformed into a "pseudo-image domain." The multiplication of the encoding matrix, E, by the iDFT matrix, D, acts to sparsify the encoding matrix, E, because the application of the alternating encoding gradients has blurred the k-space data along the readout direction. When the acquired image data is undersampled in the phase-encoding direction, a reduced FOV is achieved in the image domain. The combined effect of the alternating encoding gradients and the reduced FOV is a pair-wise aliasing of two rows of voxels in the pseudo-image space; thus, the encoding matrix becomes a sparse matrix that can be decoupled into small matrices each corresponding to a system of equations for two rows of image data. The small matrices may be formed based on knowledge of the point spread function ("PSF"), in which instance it may not be necessary to calculate the sparsified encoding matrix, $\tilde{E}$.

Because wave-CAIPIRINHA provides additional encoding information and, thereby, reduces the g-factor penalty for parallel image reconstruction, the benefit of wave-CAIPIRINHA is not limited to improving g-factor performance for imaging acquisitions that utilize in-plane acceleration. Rather, as noted above, the provided wave-CAIPIRINHA method is a general method that can be utilized to reduce g-factor penalty of three-dimensional acquisitions and simultaneous multi-slice acquisitions that do not utilize in-plane acceleration. When no in-plane acceleration is employed, the wave-CAIPIRINHA method can be used to provide a multi-slice acquisition in which more image slice locations may be simultaneously acquired without significant g-factor penalty.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for directing a magnetic resonance imaging (MRI) system to form echo signals from spins in a volume-of-interest, the steps of the method comprising:
   directing the MRI system to perform a pulse sequence that includes:
   i) generating a radio frequency (RF) field that rotates a net magnetic moment of spins in a volume-of-interest;
   ii) applying a readout magnetic field gradient to the volume-of-interest;
   iii) applying a first alternating magnetic field gradient along a first spatial direction;
   iv) applying a second alternating magnetic field gradient along a second spatial direction that is orthogonal to the first spatial direction; and
   wherein the readout magnetic field, the first alternating magnetic field gradient, and the second alternating magnetic field gradient are applied substantially contemporaneously after the RF field is generated so as to form an echo signal that includes spatial frequency information that is aliased in a pattern that distributes the aliased spatial frequency information in three dimensions in k-space.

2. The method as recited in claim 1 in which the readout magnetic field, the first alternating magnetic field gradient, and the second alternating magnetic field gradient are applied such that the aliased spatial frequency information is distributed substantially uniformly in three dimensions in k-space.

3. The method as recited in claim 1 in which the first magnetic field gradient and the second alternating magnetic field gradient have at least one of a sinusoidal waveform, a triangular waveform, a square waveform, and a trapezoidal waveform.

4. The method as recited in claim 1 in which the first alternating magnetic field gradient is applied such that it is out-of-phase with the second alternating magnetic field gradient.

5. The method as recited in claim 1 in which an integral with respect to time of the first alternating magnetic field gradient and of the second alternating magnetic field gradient is equal to zero.

6. The method as recited in claim 1 in which the volume-of-interest comprises a plurality of different slice locations that are simultaneously affected by the generated RF field.

7. The method as recited in claim 6 in which the generated RF field is a phase-modulated multi-band RF field that imparts a different phase value to echo signals formed in each of the plurality of different slice locations.

8. A method for imaging a subject with a magnetic resonance imaging (MRI) system, the steps of the method comprising:
   a) applying with the MRI system, a radio frequency (RF) excitation field to a portion of a subject that includes a volume-of-interest;
   b) establishing with the MRI system, a readout magnetic field gradient after applying the RF excitation field in step a) to form echo signals;
   c) establishing with the MRI system, an alternating magnetic field gradient along a partition-encoding direction while the readout gradient is established;
   d) establishing with the MRI system, another alternating magnetic field gradient along a phase-encoding direction while the readout gradient and alternating gradient are established;
   e) acquiring with an array of RF receiver coils, image data indicative of the echo signals formed in step b); and
   f) reconstructing an image of the subject from the image data acquired in step d).

9. The method as recited in claim 8 in which the alternating magnetic field gradient established in step c) and the another alternating magnetic field gradient established in step d) have at least one of a sinusoidal waveform, a triangular waveform, a square waveform, and a trapezoidal waveform.

10. The method as recited in claim 8 in which a time integral of the alternating magnetic field gradient and the another alternating magnetic field gradient is zero.

11. The method as recited in claim 8 in which step f) includes forming a system of equations that relates image values in the reconstructed image to the image data acquired in step b) and an encoding matrix that accounts for spatial encoding provided by the alternating magnetic field gradient established in step c) and the another alternating magnetic gradient field established in step d).

12. The method as recited in claim 11 in which step f) includes sparsifying the encoding matrix in the system of equations formed in step f).

13. The method as recited in claim 12 in which the encoding matrix is sparsified in step f) by applying a discrete Fourier transform to the encoding matrix, the discrete Fourier transform accounting for a transformation from k-space to an image domain as if the alternating magnetic field gradient and the another alternating magnetic field gradient were not applied.

14. The method as recited in claim 8 in which the image data acquired in step b) is undersampled along at least one direction.

15. The method as recited in claim 14 in which the image data acquired in step b) is undersampled along both the partition-encoding direction and the phase-encoding direction.

16. The method as recited in claim 8 in which the alternating magnetic field gradient established in step c) is out-of-phase with the another alternating magnetic field gradient established in step d).

17. The method as recited in claim 8 in which the volume-of-interest comprises a plurality of different slice locations that are simultaneously excited by the RF excitation field in step a), and the partition-encoding direction is a slice-encoding direction.

18. The method as recited in claim 17 in which the RF excitation field applied in step a) is a phase-modulated multi-band RF excitation field that imparts a different phase value to echo signals formed in each of the plurality of different slice locations.

19. The method as recited in claim 17 in which:
   the plurality of different slice locations include a current slice location and at least one adjacent slice location; and
   step c) includes applying a slice-encoding gradient blip along the slice-encoding direction before the alternating gradient is applied but while the readout gradient is applied in order to impart a phase shift to the formed echo signals such that image data corresponding to the at least one adjacent slice location is shifted by a selected percentage of a field-of-view (FOV) of the current slice location.

20. The method as recited in claim 17 in which:

the plurality of different slice locations include a current slice location and at least one adjacent slice location;

the readout gradient applied in step b) is an alternating readout gradient;

step c) includes sequentially producing a plurality of slice-encoding gradient blips along the slice-encoding direction before the alternating gradient is applied but while the alternating readout magnetic gradient is applied in order to impart a phase shift to the formed echo signals such that image data corresponding to the at least one adjacent slice location is shifted by a selected percentage of a field-of-view (FOV) of the current slice location; and step d) includes sequentially producing a plurality of phase-encoding gradient blips along the phase-encoding direction before the alternating gradient is applied but while the alternating readout magnetic gradient is applied.

* * * * *